United States Patent [19]

Upton et al.

[11] Patent Number: 5,420,541
[45] Date of Patent: May 30, 1995

[54] MICROWAVE DOHERTY AMPLIFIER

[75] Inventors: David M. Upton, Mont Vernon, N.H.; Robert J. McMorrow, Boston, Mass.

[73] Assignee: Raytheon Company, Lexington, Mass.

[21] Appl. No.: 72,267

[22] Filed: Jun. 4, 1993

[51] Int. Cl.$^6$ .......................... H03F 3/60; H03F 3/68
[52] U.S. Cl. ..................... 330/286; 330/295
[58] Field of Search .................. 330/295, 286, 53, 54, 330/124 R

[56] References Cited

U.S. PATENT DOCUMENTS

| | | | |
|---|---|---|---|
| 2,210,028 | 8/1940 | Doherty | 179/171 |
| 3,275,950 | 9/1966 | Birr | 332/43 |
| 3,436,686 | 4/1969 | Vackar | 332/64 |
| 3,711,782 | 1/1973 | Perrero | 330/295 |
| 4,187,471 | 2/1980 | Shimoji | 330/295 |
| 4,258,328 | 3/1981 | Prevot | 330/295 |
| 4,335,363 | 6/1982 | Bowers | 332/37 R |
| 4,638,261 | 1/1987 | McGuire | 330/286 |
| 4,754,229 | 6/1988 | Kawakami | 330/286 |
| 4,803,443 | 2/1989 | Takagi | 330/295 |
| 5,105,167 | 4/1992 | Peczalski | 330/295 |

OTHER PUBLICATIONS

Microwave Journal, Jun. 1977, pp. 79–82.
IEEE, MTT–27, No. 5, May 1979 pp. 406–411.
"A New High Efficiency Power Amplifier for Modulated Waves," W. H. Doherty, Proceedings of the Institute of Radio Engineers, vol. 24, No. 9, Sep. 1936, pp. 1163–1183.
"A High Power Outphasing Modulation," H. Chireix, Reprinted from Proceedings of the Institute of Radio Engineers, vol. 23, No. 11, 1935, pp. 237–247. (Enclosed Copy of Document pp. 316–326).
"A Wide–Band Low Noise L–Band Balanced Transistor Amplifier", R. S. Engelbrecht and K. Kurokawa, Proceedings IEEE, vol. 53, pp. 316–326, Mar. 1965.
"Radio Engineering Handbook," Keith Henney, Editor–In–Chief, Fifth Edition, McGraw–Hill Book Company, pp. 18–39, 1959.
"HEAD–a high efficiency amplitude–modulated system for broadcasting transmitters," D. F. Bowers, Communications & Broadcasting, vol. 7, No. 2, pp. 15–23, Feb. 1982.
"Efficiency of Doherty RF Power–Amplifier Systems," F. H. Raab et al., IEEE Transactions on Broadcasting, vol. BC–33, No. 3, Sep. 1987, pp. 77–83.
"Output Performance of Idealized Microwave Power Amplifiers," L. J. Kushner, Microwave Journal, Oct. 1989, pp. 103–116.
"Medium Frequency Standard Broadcast Transmitter," J. B. Stanton, Continental Electronics Manufacturing Company, Cathode Press, vol. 22, No. 4, 1965, pp. 23–30.

Primary Examiner—Steven Mottola
Assistant Examiner—Tiep H. Nguyen
Attorney, Agent, or Firm—Walter F. Dawson

[57] ABSTRACT

An improved Doherty amplifier for operation at microwave frequencies using microstrip circuit technology and gallium arsenide devices to achieve greater efficiency and linearity. The circuit divides the input power equally between a carrier amplifier and peak amplifier with a quarter-wave delay at the input to the peak amplifier insuring that the output power of the two amplifiers will be in phase at the load. A three-port network combines the phase-delayed carrier amplifier output with the output of the peak amplifier. The outputs of the two amplifiers are connected together by a quarter wave transmission line of impedance R. A load of one-half the optimum load (R/2) is attached to the output of the peak amplifier. A quarter-wave line section provides the transition from R/2 to the desired impedance, R. When the peak amplifier is off, its output impedance is infinite and the output power of the carrier amplifier is delivered entirely to the load. As the peak amplifier becomes more active, it delivers more of its output power to the load while its output current gradually reduces the effective load impedance seen by the carrier amplifier thus allowing it to deliver more power. In this way the microwave Doherty amplifier allows 6 dB of linear power amplification beyond the point where a normal Class "B" amplifier begins to saturate and the microwave amplifier efficiency remains close to the maximum attainable linear efficiency.

64 Claims, 9 Drawing Sheets

MICROWAVE DOHERTY AMPLIFIER

BACKGROUND OF THE INVENTION

This invention relates to microwave frequency power amplifiers used in microwave frequency transmitters and in particular to an apparatus and method of achieving improved efficiency and linearity with a microwave Doherty amplifier.

New commercial and military telecommunications systems over the past few years have shown a trend toward using digital modulation techniques. These digital systems require the capacity to handle a high density of carrier frequencies in order to remain cost effective. The additional trend toward space based systems imposes high efficiency and weight minimization constraints. Power amplifiers represent an important design challenge as they must conform to the above specifications. Unfortunately, high efficiency in power amplifiers has been difficult to attain for a large number of carrier frequencies. In fact, this is a direct trade-off in conventional amplifier design.

In conventional power amplifiers, it is important to note that the amount that the input drive level must be reduced from the saturation level is directly proportional to the number of carrier frequencies being amplified; also, there exists a direct trade-off between linearity and efficiency. An increased number of carrier frequencies compounds the efficiency problem since the amplifier enters gain compression earlier (at a lower drive level) than in a single tone case due to the increased peak-to-average ratio within the exciting signal. Previous techniques developed to overcome this problem require complicated circuit designs that are large and difficult to implement. None of these techniques were suitable for implementation in a space based communication or radar system due to their size, weight, reliability or complexity.

The Doherty amplifier was first suggested by W. H. Doherty in 1936 and is discussed in a technical paper entitled "A New High Efficiency Power Amplifier For Modulated Waves," W. H. Doherty, Proceedings of the Institute of Radio Engineers, Vol. 24, No. 9, September 1936. Originally intended for use in low to medium frequency amplitude modulated broadcasting transmitters, the suggested scheme can be modified and updated to solve the aforementioned amplifier difficulties. In a conventional amplifier there is a direct relationship between efficiency and the input drive level. Therefore, high efficiency is not attained until the RF input power becomes sufficiently high to drive the amplifier into saturation. Since in multi-carrier communication systems an amplifier must remain as linear as possible in order to avoid intermodulation distortion, this region of high efficiency cannot be used. A theoretical Doherty amplifier does not have the same relationship between efficiency and input drive level; hence a high efficiency linear region is created.

The Doherty amplifier scheme achieves high linear efficiency by having one Class B amplifier operated at the point where the output begins to saturate, and where the highest linear efficiency is obtained. A second amplifier is used to affect the first so that overall linearity can be maintained as it is driven beyond this point. A Doherty amplifier circuit using two vacuum tubes and two phase-shift networks is shown in FIG. 1 which is from the "Radio Engineering Handbook," Keith Henney, Editor-in-Chief, Fifth Edition, McGraw-Hill Book Company, 1959, pp. 18–39. Also, the Doherty amplifier is described in U.S. Pat. No. 2,210,028, issued in 1940 to W. H. Doherty. A first electron discharge tube conducts continuously and is termed the carrier tube whereas a second electron discharge tube does not conduct for the whole period of each cycle of a modulation signal and is termed the peaking tube.

Class B amplification of radio-frequency waves, having been known and used in the design of high power RF amplifiers through the early 1930s, was first improved by the technique published in the Proceedings of the Institute of Radio Engineers, Vol 23, No. 11, by H. Chireix in 1935, titled "High Power Outphasing Modulation." The Chireix "outphasing" system splits the output of a radio frequency oscillator into two equal amplitude and equal phase signals. These signals then pass into phase-shifting networks of 90 degrees leading and 90 degrees lagging. An amplifier in each leg modulates the phase-shifted signal when driven by a low-level phase modulated signal derived from the intended modulation and the original carrier frequency wave. It is necessary that the directions of the phase modulation imposed on the delayed RF carriers be opposite to each other. Therefore, with the above condition in mind, each signal represents an RF wave 90 degrees out-of-phase with respect to the original carrier with an oppositely directed phase "wobble" (the intended modulation) on each of them. Both signals are used to drive a pair of conventional high-efficiency power amplifiers operating in Class C. The amplifiers are adjusted in exactly the same manner so as to preserve the insertion phase of the stages relative to each other. Output from each amplifier is delayed by an additional 90 degree network the outputs of which are connected directly together with the load, being taken from a mid-point so formed.

Vector summation of the phasors at the common point shows that, provided all of the conditions above are met, a linear amplifier of high efficiency exists at maximum output power (also, maximum modulation). In the Chireix outphasing system, the efficiency degrades quickly as the output power or the modulation index is reduced since the phase relationships stated do not allow the reactive components generated at the final combining network to completely cancel presenting a resistive load except in the case where maximum power at maximum modulation is being produced. The Chireix system also has the disadvantage of requiring numerous critical tuning adjustments while the bandwidth and linearity of the phase modulation circuit is of great concern in a wideband application. A Doherty amplifier circuit achieves better overall efficiency as a function of drive, eliminates these critical adjustments to a large extent, simplifies the realization of the overall transmitter, and does not have an implicit bandwidth limitation like the Chireix design.

A more modern method, that upon first glance looks like a Doherty amplifier, is the balanced amplifier technique of Kurokawa as described in the article "A Wide-Band Low Noise L-Band Balanced Transistor Amplifier," R. S. Engelbrecht and K. Kurokawa, Proceeding IEEE, Vol. 53, pp. 237–247, March 1965. An input excitation is fed to two identical amplifiers ninety (90) degrees out-of-phase from a quadrature hybrid network. The output signals from the two amplifiers are recombined in another quadrature hybrid network to form an in-phase single-ended output signal. Two major differences from the Doherty amplifier concept are as follows: (1) No provision is made to alter the bias points of the two amplifiers at the input as is done in the Doherty. Indeed, in the balanced amplifier this is undesirable as the mis-match seen by the hybrid network would result in increasing losses in the termination resistor of the network; and (2) The output of each amplifier combined by the action of the hybrid network precludes the two amplifiers interacting so as to "pull" or influence the load seen by one amplifier over the other as in the Doherty. In fact, the direct interaction of the two amplifiers within a three-port Doherty network accounts for all of the observed efficiency enhancement of the Doherty amplifier and is central to its operation.

The manner in which the invention deals with the disadvantages of the prior art to provide improved efficiency and linearity with a microwave Doherty amplifier will be evident as the description proceeds.

SUMMARY OF THE INVENTION

Accordingly, it is therefore an object of this invention to provide a microwave frequency amplifier with improved efficiency and linearity.

It is a further object of this invention to improve a low to medium frequency Doherty type of amplifier for operation at microwave frequencies such as 1300 MHz using semiconductor devices.

The objects are further accomplished by providing a microwave frequency amplifier comprising means coupled to an input signal for producing a phase quadrature relationship over a broad-band between a first output signal and a second output signal from the phase quadrature producing means, carrier amplifier means for amplifying the first output signal from the phase quadrature producing means, peak amplifier means for amplifying the second output signal from the phase quadrature producing means, distributed line means coupled between an output of the carrier amplifier means and an output of the peak amplifier means for controlling the phase of the output of the carrier amplifier means relative to the output of the peak amplifier means whereby the carrier amplifier means output and the peak amplifier means output combine in additive phase, and the distributed line means further provides impedance transforming action to an apparent load presented to the carrier amplifier means as a function of the degree of conduction of the peak amplifying means, and means coupled to the phase controlling means and the output of the peak amplifier means for producing a predetermined output impedance of the microwave frequency amplifier. The microwave frequency amplifier operates over a plurality of microwave frequencies including 1300 MHz. The input signal comprises multi-carrier signals, a continuous single carrier that varies in amplitude, or a multi-carrier signal with each carrier signal varying in amplitude. The carrier amplifier means comprises a gallium arsenide semiconductor device, and the peak amplifier means comprises a gallium arsenide semiconductor device.

The objects are further accomplished by a microwave frequency amplifier comprising means coupled to an input signal for producing a phase quadrature relationship over a broad-band between a first output signal and a second output signal from the phase quadrature producing means, means for amplifying the first output signal, first means coupled between the first output signal and the first output signal amplifying means for matching the impedance at the input of the first output signal amplifying means to the output impedance of the first output signal, means for amplifying the second output signal, second means coupled between the second output signal and the second output signal amplifying means for matching the impedance at the input of the second output signal amplifying means to the output impedance of the second output signal, means coupled to the first matching means for biasing a control input of the first output signal amplifying means, means coupled to the second matching means for biasing a control input of the second output signal amplifying means, distributed line means coupled between an output of the first output signal amplifying means and an output of the second output signal amplifying means for controlling the phase of the output of the first output signal amplifying means relative to the output of the second output signal amplifying means whereby the first output signal amplifying means output and the second output signal amplifying means output combine in additive phase, the distributed line means further provides impedance transforming action to an apparent load presented to the first output signal amplifying means as a function of the degree of conduction of the second output signal amplifying means, and means coupled to the phase controlling means and the output of the second output signal amplifying means for producing a predetermined output impedance of the microwave frequency amplifier. The microwave frequency amplifier operates over a plurality of microwave frequencies including 1300 MHz. The input signal comprises multi-carrier signals, a continuous single carrier that varies in amplitude, or a multi-carrier signal with each carrier signal varying in amplitude. The first output signal amplifying means comprises a gallium arsenide semiconductor device, and the second output signal amplifying means comprises a gallium arsenide semiconductor device. The distributed line means comprises a quarter-wave transformer. The predetermined output impedance producing means comprises a transmission line connected to a quarter-wave transformer. The degree of conduction of the second output signal amplifying means is determined by an input drive level relative to the control input applied to the second output signal amplifying means. The first matching means and the second matching means each comprises a transmission line.

The objects are further accomplished by a microwave frequency amplifier comprising means coupled to an input signal for producing a phase quadrature relationship over a broad-band between a first output signal and a second output signal from the phase quadrature producing means, means for amplifying the first output signal, first means coupled between the first output signal and the first output signal amplifying means for matching the impedance at the input of the first output signal amplifying means to the output impedance of the first output signal, means for amplifying the second output signal, second means coupled between the second output signal and the second output signal amplifying means for matching the impedance at the input of the second output signal amplifying means to the output impedance of the second output signal, means coupled to the first matching means for biasing a control input of the first output signal amplifying means, means coupled to the second matching means for biasing a control input of the second output signal amplifying means, distributed line means coupled between an output of the first output signal amplifying means and an output of the second output signal amplifying means for controlling the phase of the output of the first output signal amplifying means relative to the output of the second output signal amplifying means whereby the first output signal amplifying means output and the second output signal amplifying means output combine in additive phase and the distributed line means further provides impedance transforming action to an apparent load presented to the first output signal amplifying means as a function of the degree of conduction of the second output signal amplifying means, means coupled to the phase controlling means and the output of the second output signal amplifying means for providing an output matching network, first reactive network means coupled to the first output signal amplifying means output for canceling capacitance present at the first output signal amplifying means output, second reactive network means coupled to the second output signal amplifying means for canceling capacitance present at the second output signal amplifying means output, means coupled to the first output signal amplifying means output for providing zero impedance to a second harmonic of a design frequency at the first output signal amplifying means output, and means coupled to the second output signal amplifying means output for providing zero impedance to a second harmonic of a design frequency at the second output signal amplifying means output. The microwave frequency amplifier operates over a plurality of microwave frequencies including 1300 MHz. The input signal comprises multi-carrier signals, a continuous single carrier that varies in amplitude, or a multi-carrier signal with each carrier signal varying in amplitude. The first output signal amplifying means comprises a gallium arsenide semiconductor device, and the second output signal amplifying means comprises a gallium arsenide semiconductor device. The output matching network provides a predetermined output impedance. The degree of conduction of the second output signal amplifying means is determined by an input drive level relative to the control input applied to the second output signal amplifying means. The first matching means and the second matching means each comprises a band-pass network.

The objects are further accomplished by a method of operating a high efficiency microwave frequency amplifier comprising the steps of providing a phase quadrature relationship over a broad-band between a first output signal and a second output signal from a phase quadrature producing means coupled to an input signal, amplifying the first output signal from the phase quadrature producing means with a carrier amplifier means, amplifying the second output signal from the phase quadrature producing means with a peak amplifier means, controlling the phase of the output of the carrier amplifier means relative to the output of the peak amplifier means with a distributed line means coupled between an output of the carrier amplifier and an output of the peak amplifier whereby the carrier amplifier means output and the peak amplifier means output combine in addition phase, the distributed line means further providing impedance transforming action to an apparent load presented to the carrier amplifier means as a function of the degree of conduction of the peak amplifier means, and producing a predetermined output impedance of the microwave frequency amplifier with means coupled to the phase controlling means and the output of the peak amplifier means. The microwave frequency amplifier operates over a plurality of microwave frequencies including 1300 MHz. The step of providing a phase quadrature relationship comprises the step of the phase quadrature producing means being coupled to an input signal having multi-carrier signals, a continuous single carrier that varies in amplitude, or a multi-carrier signal with each carrier signal varying in amplitude. The step of amplifying the first output signal includes the step of operating a gallium arsenide semiconductor device. The step of amplifying the second output signal includes the step of operating a gallium arsenide semiconductor device.

The objects are further accomplished by a method of operating a microwave frequency amplifier having improved efficiency and linearity comprising the steps of producing a phase quadrature relationship over a broad-band between a first output signal and a second output signal from a phase quadrature producing means coupled to an input signal, amplifying the first output signal, matching the impedance at the input of the first output signal amplifying means to the output impedance of the first output signal with a first matching means coupled between the first output signal and the first output signal amplifying means, amplifying the second output signal, matching the impedance at the input of the second output signal amplifying means to the output impedance of the second output signal with a second matching means coupled between the second output signal and the second output signal amplifying means, biasing a control input of the first output signal amplifying means with means coupled to the first matching means, biasing a control input of the second output signal amplifying means with means coupled to the second matching means, controlling the phase of the output of the first output signal amplifying means relative to the output of the second output signal amplifying means with a distributed line means coupled between an output of the first output signal amplifying means and an output of the second output signal amplifying means, whereby the first output signal amplifying means output and the second output signal amplifying means output combine in additive phase, the distributed line means further providing impedance transforming action to an apparent load presented to the first output signal amplifying means as a function of the degree of conduction of the second output signal amplifying means, and producing a predetermined output impedance of the microwave frequency amplifier with means coupled to the phase controlling means and the output of the second output signal amplifying means. The microwave frequency amplifier operates over a plurality of microwave frequencies including 1300 MHz. The step of providing a phase quadrature relationship comprises the step of the phase quadrature producing means being coupled to an input signal having multi-carrier signals, a continuous single carrier that varies in amplitude, or a multi-carrier signal with each carrier signal varying in amplitude. The step of amplifying the first output signal includes the step of operating a gallium arsenide semiconductor device. The step of amplifying the second output signal includes the step of operating a gallium arsenide semiconductor device.

BRIEF DESCRIPTION OF THE DRAWINGS

Other and further features and advantages of the invention will become apparent in connection with the accompanying drawings wherein.

DESCRIPTION OF THE PREFERRED EMBODIMENT

Figure 1:
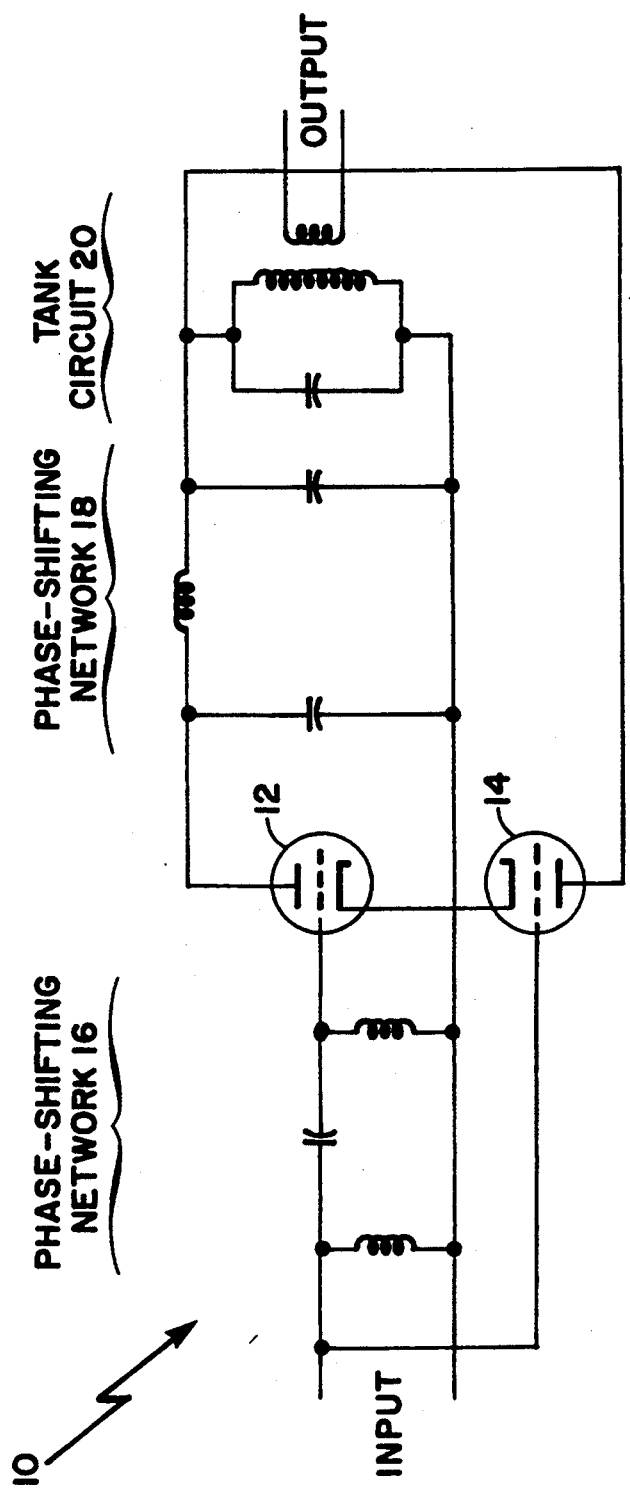
FIG. 1 shows a "tube" Doherty amplifier circuit of the prior art.

Referring now to FIG. 1, a vacuum tube Doherty amplifier known in the prior art of full carrier double sideband shortwave and mediumwave broadcasting is shown which is implemented with two vacuum tubes and achieves high efficiency. One tube 12 operates near maximum efficiency at carrier level and is modulated downward on the negative modulation peaks. The second tube 14 functions only on the positive modulation peaks. Ninety degree networks 16, 18 couple the grid 22 and plate 21 of the carrier tube 12 to the grid 25 and plate 24 of the peak tube 14 respectively. The peak tube 14 is biased so that it operates only on the positive modulation peaks and is cut off on the negative peaks. The ninety degree networks 16, 18 cause most of the RF load to transfer from one tube to the other over the modulation cycle. The Doherty amplifier achieves high linear efficiency by having one Class B amplifier operated at the point where the output begins to saturate, and where the highest linear efficiency is obtained. The second amplifier is used to affect the first so that overall linearity can be maintained as it is driven beyond this point.

Figure 2:
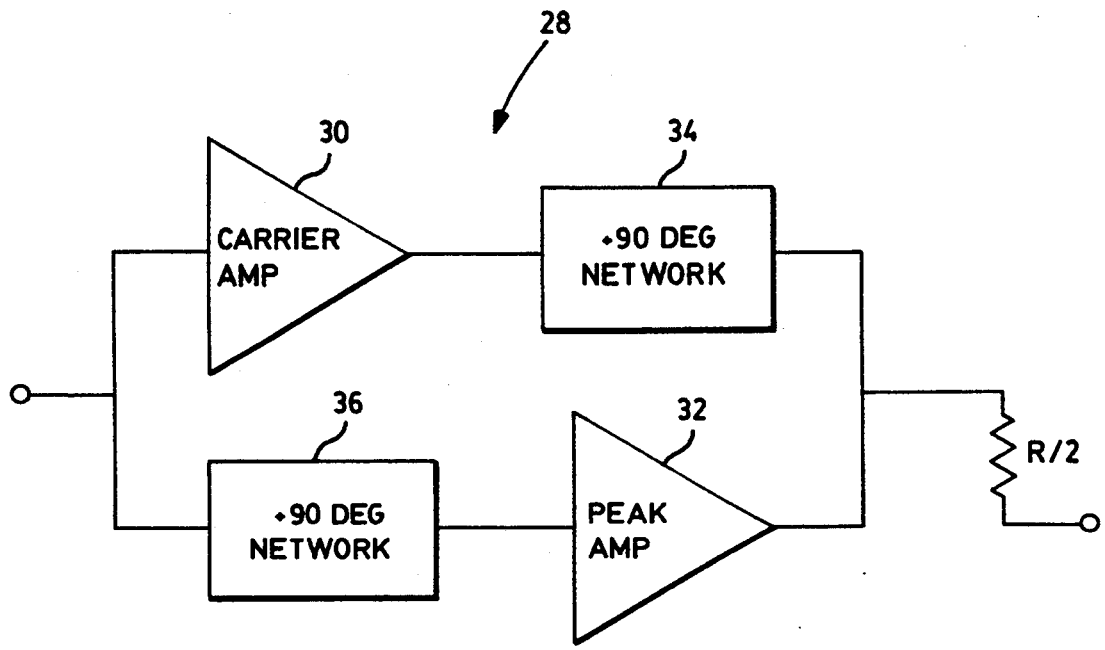
FIG. 2 is a simplified block diagram of a Doherty amplifier used to illustrate operation at peak output power.

Referring now to FIG. 2, a Doherty amplifier 28 in general comprises two amplifiers, a "carrier" amplifier 30 and a "peak" amplifier 32, both designed to deliver maximum power with optimum efficiency to a load-line resistance of R. The carrier amplifier 30 is a normal Class B amplifier (i.e. operates over approximately 180° of the input signal's periodic sinusoidal variation) while the peak amplifier 32 is designed to only amplify signals which exceed some minimum threshold. This can be accomplished by biasing the active device of the amplifier further into Class B. The outputs of the two amplifiers are connected to a load of R/2 attached to the circuit output. Input power to the amplifier is divided equally to ensure that the output power of the two amplifiers at the load R/2 will be in phase. Note that the peak amplifier 32 is driven 90 degrees out-of-phase with respect to the carrier amplifier 30.

Figure 3:
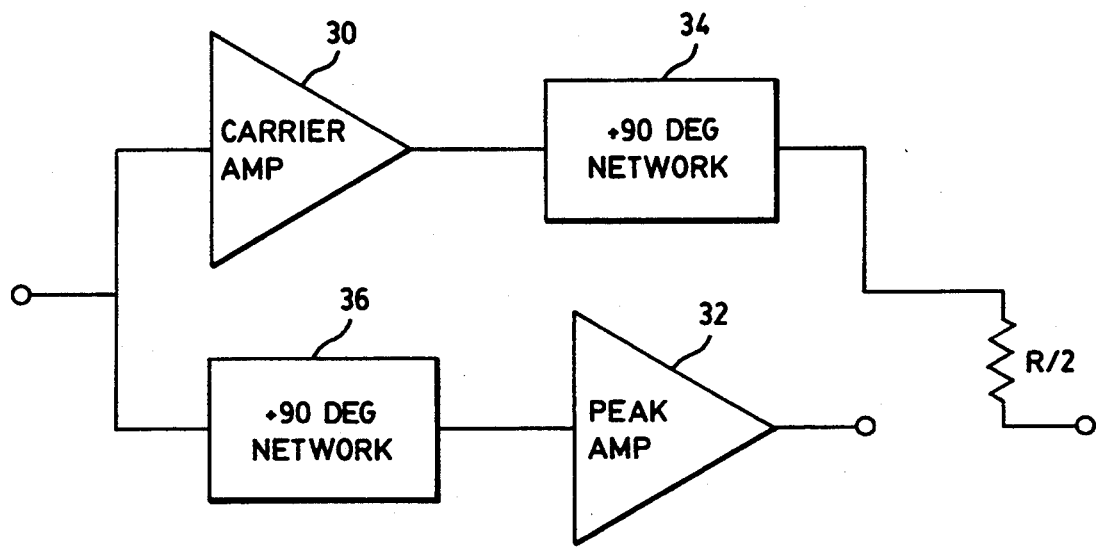
FIG. 3 is a simplified block diagram of a Doherty amplifier used to illustrate operation at low input signal levels.

Referring now to FIG. 2 and FIG. 3, it is easiest to understand the operation of a Doherty amplifier by considering its two extremes of operation. One operation extreme shown in FIG. 3 occurs when the input power is not sufficient to turn on the peak amplifier 32 and all of the output power is supplied by the carrier amplifier 30. When the peak amplifier 32 is off, its output impedance is ideally infinite and the output power of the carrier amplifier is delivered entirely to the load R/2. The load actually presented to the carrier amplifier by the quarter-wave network 34 is 2R. At this point, the device current in the carrier amplifier 30 is one-half ($\frac{1}{2}$) the current delivered at maximum power. Doubling the optimum load of a Class B amplifier will allow the device to deliver half of the maximum output power. However, since the DC current of a Class B amplifier is proportional to the output current, the maximum efficiency will remain the same. So in this case, half of the maximum output power of the carrier amplifier is supplied to the load with maximum linear efficiency.

Another operation extreme shown in FIG. 2 occurs when sufficient input power is provided to allow the peak amplifier 32 to become saturated. In this case two parallel amplifiers are delivering their respective maximum output power to the equivalent load R/2. The load that each amplifier sees in this extreme is simply R. Note that the load presented at the carrier amplifier 30 across the quarter-wave network 34 will also be R. Each amplifier is delivering current to its load R, and since the loads are connected in parallel the effective load is R/2.

Still referring to FIG. 2, for points of operation between these two extremes the Doherty amplifier operates in the following manner: The peak amplifier 32 is designed to begin operating when the carrier amplifier 30 just begins to saturate. Maximum linear efficiency is obtained at this point. As the input drive level is further increased, the peak amplifier 32 begins to conduct heavily. As the peak amplifier 32 becomes more active it will deliver more of its output power to the load while its output current will gradually reduce the effective load impedance seen by the carrier amplifier 30 allowing it to deliver more power. This continues until the second extreme is reached. At this point, four times the output power of the carrier amplifier 30 alone will be delivered to the load and the maximum efficiency will again be obtained. The efficiency in between the two extreme points of operation will decrease only slightly from the maximum since the duty factor for the peak amplifier 32 is relatively low. The Doherty amplifier 28 effectively allows 6 dB of linear power amplification beyond the point where a normal Class B amplifier begins to saturate, and for the 6 dB extension amplifier efficiency remains close to the value of the maximum attainable linear efficiency.

Figure 4:
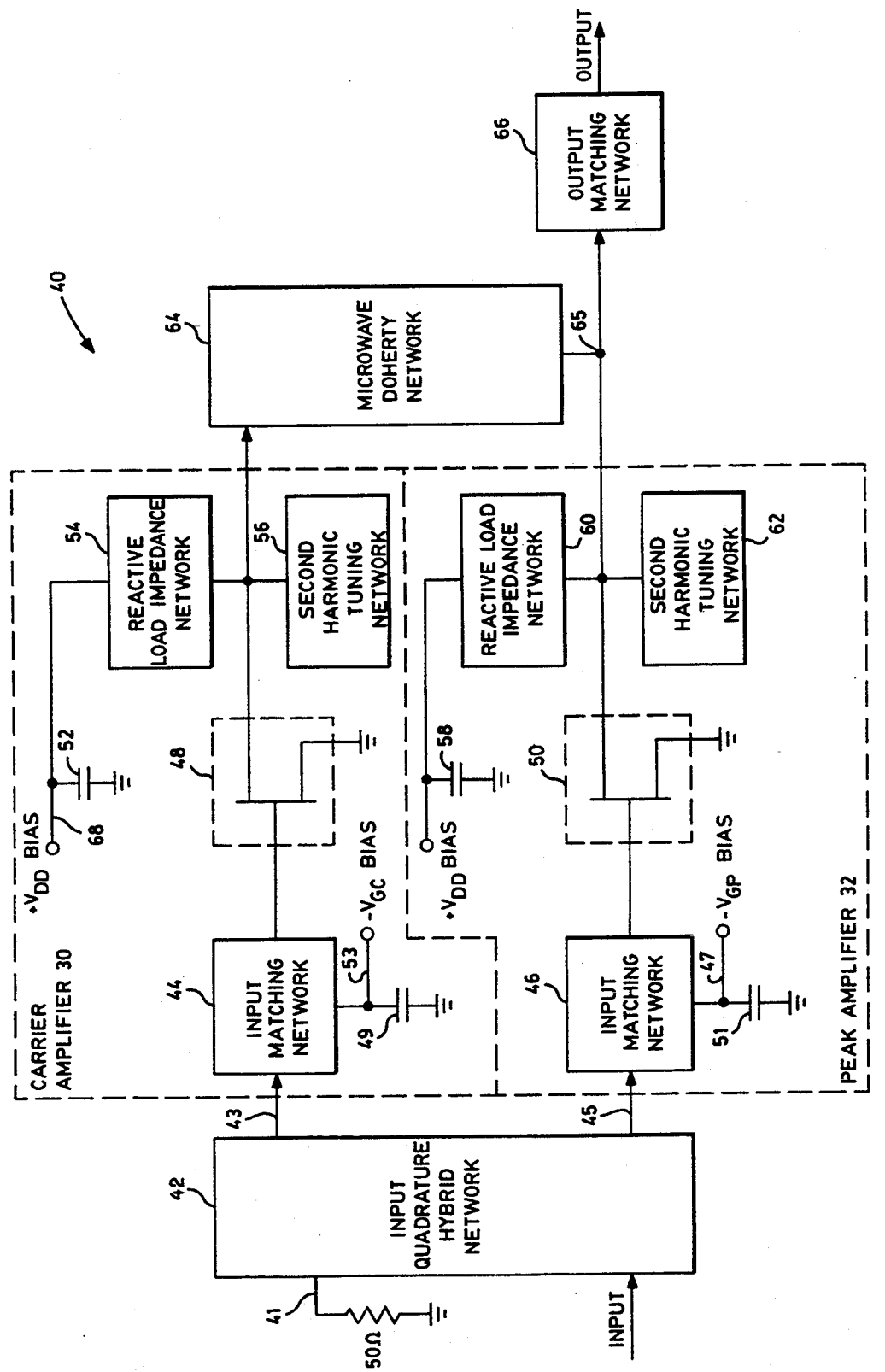
FIG. 4 is a general block diagram of a microwave Doherty amplifier.

Referring now to FIG. 4, a general block diagram of a microwave Doherty amplifier 40 is shown comprising an input quadrature hybrid network 42, a carrier amplifier 30, a peak amplifier 32, a microwave Doherty network 64 and an output matching network 66. The carrier amplifier 30 comprises an input matching network 44 coupled to a metal semiconductor field effect transistor (MESFET) device 48. The output of the MESFET device 48 is connected to reactive load impedance network 54, a second harmonic tuning network 56 and a microwave Doherty network 64 which may also be referred to as a quarter-wave impedance matching network. The peak amplifier 32 comprises an input matching network 46 coupled to a MESFET device 50. The output of the MESFET device 50 is connected to a reactive load impedance network 60, a second harmonic tuning network 62, the microwave Doherty network 64 and an output matching network 66.

The function of the input quadrature hybrid network 20 is to divide the input power supplied to the microwave Doherty amplifier 40 at the system impedance of 50 ohms into two equal amplitude ports, at the system impedance, with a quarter-wave (90 degree) phase difference between them. There are a wide variety of band-limited circuits which accomplish this function such as branched-line couplers and "rat-race" hybrids which are some of the better known examples in the art. Broader band components are also available from many manufacturers in the microwave industry to accomplish this particular requirement.

Identical input matching networks 44 and 46 are responsible for transforming to 50 ohms the input terminal impedance of the MESFET active devices 48 and 50. While these circuits are not essential to obtain the desired high linear efficiency of the microwave Doherty amplifier's operation, their implementation results in more stage gain with far less reflected power at the input. The required transformation can be realized using standard microwave design techniques well known to practitioners of the art. In particular, lumped reactive components (inductors and capacitors) and distributed elements are utilized to create a band-pass impedance matching filter. Another function performed by this network is to introduce bias voltages to the input terminals of the active MESFET devices 48 and 50. This path must present a near zero resistance to the bias voltages while being isolated from the RF signal path to prevent the desired operating point from being able to fluctuate on signal current peaks. Design of the band-pass impedance matching filter above must accommodate these requirements as well.

The active MESFET devices 48 and 50 are representative of a three terminal device used to achieve amplification. Any device type may be used, provided it has sufficient gain at the microwave frequency of interest. At the present state of the art, the most suitable type of active device is a gallium arsenide (GaAs) MESFET. In general, the device should have minimal (ideally zero) internal matching at the output terminal and yet be sufficiently large enough to provide one-half ($\frac{1}{2}$) of the total output power required. Both devices 48 and 50 used should be the same size although the I-V characteristics need not be matched. Additional requirements on device selection include the ability to withstand moderately high voltages such as greater than twice the operational supply bias voltage from the input to the output terminal as well as the accessibility of a useful gain while coming out of the cut-off region and above the cut-off region.

The reactive load impedance networks 54 and 60 are responsible for canceling the capacitance present at the output terminal of the active devices 48 and 50. The networks 54 and 60 should also minimize any distributed inductance from the devices 48, 50 while it may also be used to provide an RF isolated path for a DC bias voltage applied to the output terminals of the active devices 48, 50. This must be accomplished with a minimum of filtering in the RF path or the load impedance transformation, essential to microwave Doherty amplifier operation, will be compromised. A simple way to achieve this is to use a shunt inductor or a quarter-wave line at the output terminal of each active devices 48, 50. Both networks are designed to present identical impedances at their respective terminals. An additional requirement that is mostly peculiar to multi-tone operation of the microwave Doherty amplifier 40 is that such DC bias voltage must be provided through the attached network such that zero impedance is maintained for all baseband frequencies within and beyond the information bandwidth. This is required in order to minimize intermodulation distortion above and beyond the standard practice well-known in the art of terminating all RF frequencies outside of the signal path with a zero impedance.

Second harmonic matching networks 56 and 62 provide (ideally) zero impedance to the second harmonic of the design frequency at the output terminal of the active devices 48 and 50. These are not essential for microwave Doherty amplifier 40 operation, but are used to boost the overall efficiency by reflecting the second harmonic component of current back into the active devices 48 and 50 in accordance with well-known Class B theory.

The microwave Doherty network 64 performs the most important function within a microwave Doherty amplifier 40. This network 64 is a reciprocal distributed network with a characteristic impedance equal to the optimum load impedance of the active devices 48 and 50 when operating in Class B. Low loss must be maintained to ensure smooth impedance transformations for all impedances between "R"/2 and "R", to 2"R" and "R", respectively where "R" is the load line impedance of the active devices 48, 50. Both the real and reactive (if present) portion of "R" are transformed by the network 64. However, only the real portion ($R_e$) of "R" is considered here because the reactive portion transforms in a like manner provided that a distributed network is used.

The output matching network 66 transforms the impedance seen at the load end of the microwave Doherty network 64 to that required by the system interface at the output terminal of the microwave Doherty amplifier 40, nominally 50 ohms. Like the input matching networks 44 and 46, the output matching network may be designed and implemented with techniques that are well-known to any practitioner of the microwave art. Low loss is desired in the synthesis of this network to maintain the efficiency and power output obtained from the rest of the circuit.

Still referring to FIG. 4, the input power to the microwave Doherty amplifier 40 circuit goes into the input terminal of the input quadrature hybrid network 42. From there, the input signal splits into two signals present at the two output ports 43, 45 of the input quadrature hybrid network 42, which are 90 degrees out-of-phase and connected to the input terminals of the input matching networks 44 and 46, respectively. The remaining output port 41 of the input quadrature hybrid network 42 is assumed to be terminated internally or externally with a 50 ohm resistor which dissipates the reflected signal from ports 43 and 45. The port 43 leading in phase at the output of the input matching network 44 connects to the input of the carrier amplifier active device 48. The −VGC and −VGP bias voltages 53 and 47 are shunted by decoupling capacitors 49 and 51 respectively and such bias voltages are supplied to the input terminals of the active devices 48 and 50 respectively through the input impedance matching networks 44 and 46. Similarly, the output of the input matching network 46 connects to the input of the peak amplifier active device 50. The common terminals of both active devices 48 and 50 are grounded to the chassis, a standard common (cathode, emitter, or source) configuration well-known in the art.

The output terminals of MESFET active devices 48 and 50 connect to the input terminals of the reactive load impedance networks 54 and 60 respectively as well as the input terminal of the second harmonic tuning networks 56 and 62 respectively. The second harmonic tuning networks 56 and 62 represent a one port circuit to ground as there is no second set of terminals. Similarly, the reactive load impedance networks 54 and 60, which have an end tied to RF ground through by-pass capacitor 52 and 58, are also effectively one-port networks at the design frequency. Operating $+V_{DD}$ bias voltage 68 is supplied through the reactive load impedance networks 54 and 60 as mentioned hereinbefore. The output of the carrier amplifier active device 48 connects to the input terminal 63 of the microwave Doherty network 64 while the output of the peak amplifier active device 50 connects to the other terminal 65 of the microwave Doherty network 64 and the input of output matching network 66 simultaneously. Output power from the microwave Doherty amplifier 40 is extracted from the output terminal of the output matching network 66.

The additional 90 degree delay imposed by the microwave Doherty network 64 to the signal originating from the carrier amplifier 30 causes the signal from the peak amplifier 32 previously delayed in phase by 90 degrees to recombine in additive phase at the input of the output matching network 66. This is the point where (as described hereinbefore) the effective "R"/2 load is seen by both the carrier amplifier 30 and peak amplifier 32 at the condition of maximum linear output power for the entire microwave Doherty amplifier 40. The transforming action provided by the microwave Doherty network 64 to the carrier amplifier 30 as a function of the degree of conduction of the peak amplifier 32 is well-known by one of ordinary skill in the art as the inherent properties of a quarter-wave line.

The carrier and peak amplifiers 30 and 32 are biased at their input terminals such that the carrier active device 48 is operating in Class B or lightly into Class AB (where a class AB amplifier operates over greater than 180° of the input signal's periodic sinusoidal variations and less than 360° of said sinusoidal variations); whereas the peak active device 50 is operating further into Class B. Suitable bias voltages −VGC BIAS and −VGP BIAS 43 and 47 for such operation are determined from I-V characteristics of the active devices 48, 50. In the case of pseudo-morphic high electron mobility transistors (PHEMTs), it is not necessary to bias the devices into the AB region to obtain sufficient gain for the amplifier to operate, which results in a considerable savings in DC power that would otherwise be dissipated while degrading the operating efficiency.

Figure 5:
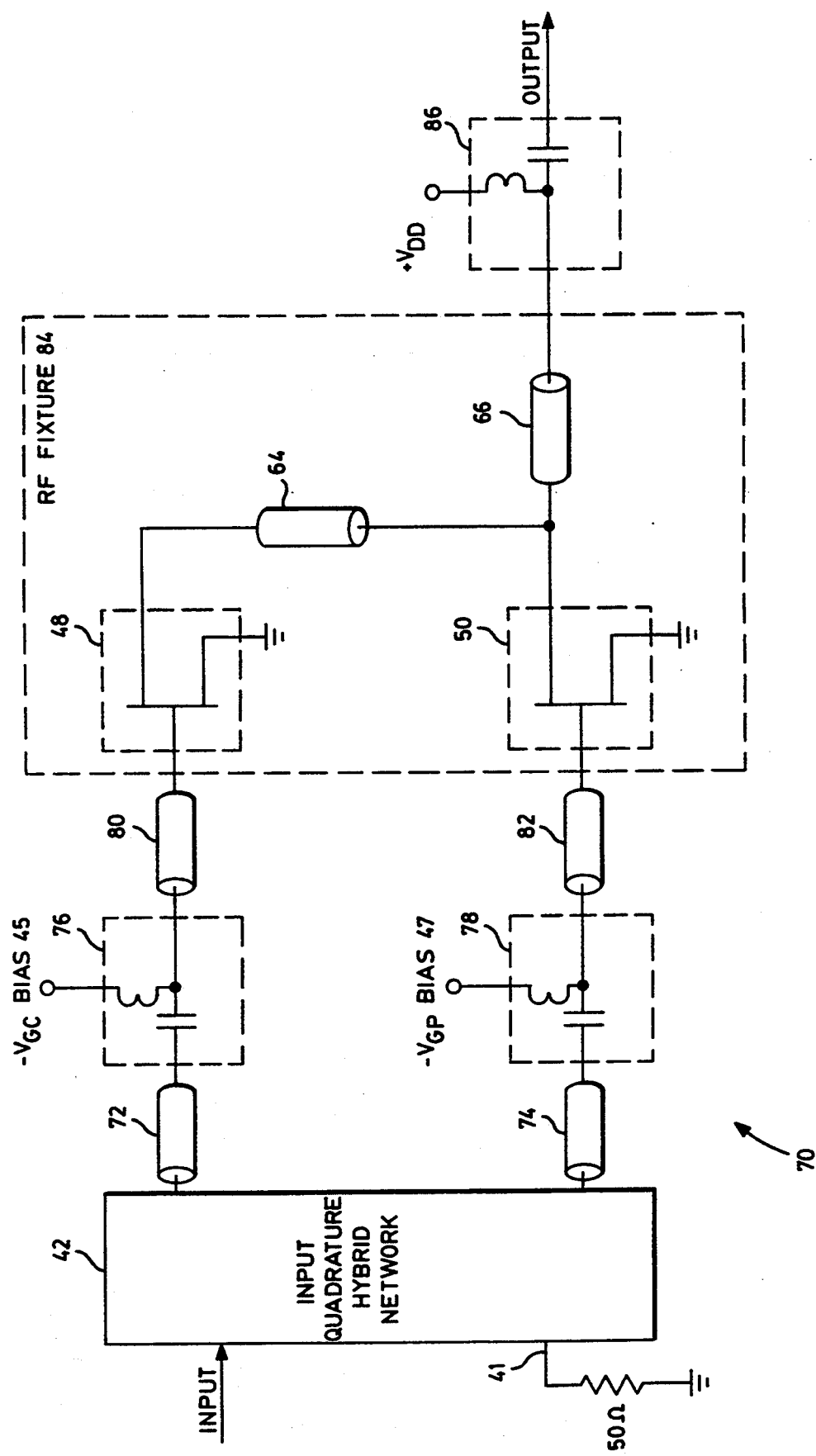
FIG. 5 is a preferred embodiment of the microwave Doherty amplifier of the invention.

Referring now to FIG. 5, a preferred embodiment of a microwave Doherty amplifier 70 is shown. The microwave Doherty amplifier 70 embodiment is a band-limited design resulting in optimum performance at 1300 MHz. The input quadrature hybrid network 42 comprises a standard −3 dB broad-band stripline coupler. It may be embodied by Model No. #3032 manufactured by Narda Microwave, of Plainview, Long Island, N.Y. One of the four ports of coupler 42 is terminated with an external 50 ohm resistor to dissipate the reflected power resulting from mismatches seen at the output ports of the quadrature hybrid network 42.

The input matching circuits 44, 46 of FIG. 4 are omitted in the FIG. 5 implementation. Instead, the 0° and −90° outputs from the input quadrature hybrid network 42 are coupled to bias tees 76 and 78 respectively, which serve to inject the −VGC and −VGP bias voltages 45 and 47 onto the signal lines. The coupling mechanism used are two semi-rigid 0.141 inch diameter coaxial transmission lines 72, 74 which are of equal length. The outputs from the bias tees 76, 78 are then coupled using more 0.141 inch diameter semi-rigid coaxial transmission lines 80, 82 to an RF test fixture 84 on which the active devices 48 and 50 are mounted. These transmission lines are also of equal length. The bias tees 76, 78 may be embodied by Model No. 11612 manufactured by Hewlett-Packard, of Palo Alto, Calif. The test fixture 84 is furnished with microwave coaxial connectors (not shown) which terminate onto a 25 mil thick 99.6% pure alumina ($Al_2O_3$) substrate upon which are printed thin film Ta/Ni/W/Au conductive microstrip lines of 24 mils in width. These lines serve to transport the microwave signal from the microwave coaxial connectors up to a center-bar where the active devices 48, 50 are mounted. Connections to and from the active devices 48, 50 are made by Thermosonic bonding with 1 mil diameter Au wire which is common practice with microwave integrated circuit technology.

The active devices 48 and 50 employ MESFETs manufactured by Raytheon Company in Andover, Mass. These discrete devices mounted on a removable center bar within the RF fixture 84 with conductive epoxy, comprise six 100 $\mu$m width gate fingers with gate lengths of 0.5 $\mu$m. An airbridged source-over-gate geometry is used to fabricate these devices. Each 100 $\mu$m cell has 50 $\mu$m channel-to-channel spacing with a source-to-drain width of 5 $\mu$m. Offset double recess gates with mesa doped at $5 \times 10^{-17}$ atoms/cm$^3$ are standard for this process while the source and drain bars are 20 $\mu$m and 30 $\mu$m in width, respectively.

For simplicity, the reactive load impedance networks 54 and 60 and the second harmonic tuning networks 56 and 62 shown in FIG. 4 are omitted in the preferred embodiment. A +VDD bias to the output terminals of each MESFET active device 48, 50 is provided by another bias tee 86, Model No. 11612 manufactured by Hewlett-Packard, of Palo Alto, Calif., and this bias tee 86 provides the output of the microwave Doherty amplifier 70.

Figure 6:
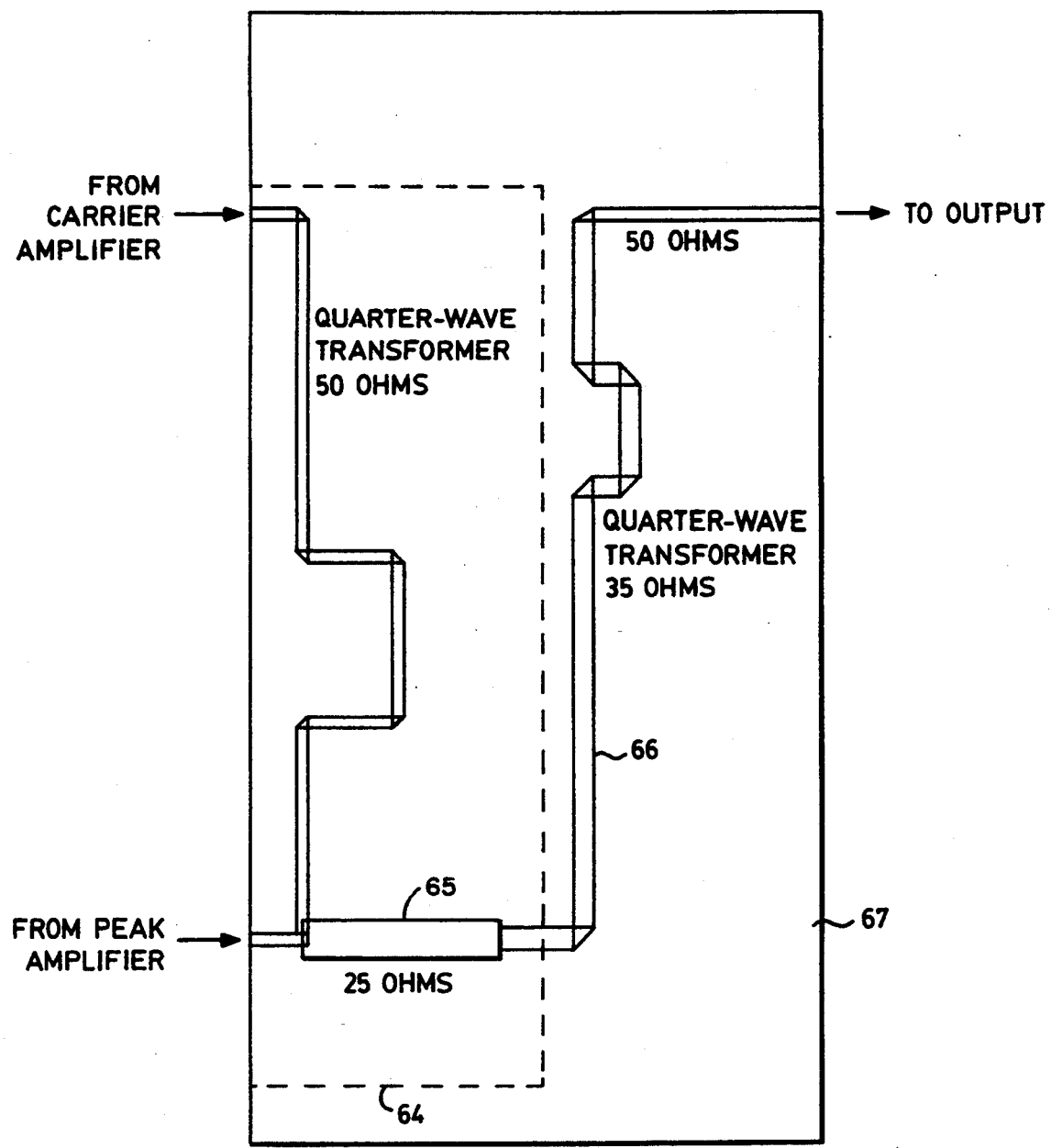
FIG. 6 shows a top view of a microwave Doherty network and output matching network fabricated on a 25 mil alumina substrate.

Referring now to FIG. 5 and FIG. 6, FIG. 6 shows the microwave Doherty network 64 and the output matching network 66 implemented on one piece of alumina ($Al_2O_3$), 99.6% pure, substrate material 67 which is 25 mils thick. An additional length of 50 ohm line is printed on the substrate so that the connections line up correctly on the RF fixture 84. The microwave Doherty network 64 is realized as a quarter-wave transformer comprising a single 50 ohm microstrip transmission line of 24 mils in width and 706 mils long. An arbitrary length of 25 ohm microstrip transmission line 65 is then merged into a 35 ohm output matching network 66 which provides the necessary impedance transformation to the system impedance of 50 ohms. The output matching network 66 is realized as a quarter-wave transformer comprising a single 35 ohm microstrip transmission line of 45 mils in width and 686 mils long. Except for the 25 ohm line, all of these lengths, calculated in accordance with standard engineering practice known in the art, represent a quarter-wave at the design frequency of approximately 1300 MHz. FIG. 6 represents a computer plot of the art work used to fabricate the alumina substrate material 67.

Fifty ohm impedance lines are used in the fabrication of this preferred embodiment since the Class B load-lines of the 600 μm MESFETs used are optimized at that point. It is generally recognized that for a normalized load-line impedance of a device ("R"/unit area), the required load-line impedance presented to the device decreases in proportion to the output power required. The load-line impedance ("R") is defined here as that impedance which when presented to the active device results in the maximum power output efficiency for that device. In general, the design of the microwave Doherty network 64 must be approximated since it represents a three-port network which is inherently interactive having parasitic components, and their respective loads may not be well defined. Microwave design techniques known to one of ordinary skill in the art may be used to compensate for the interactions encountered where the networks join together at the output of the peak amplifier device 50.

Figure 7:
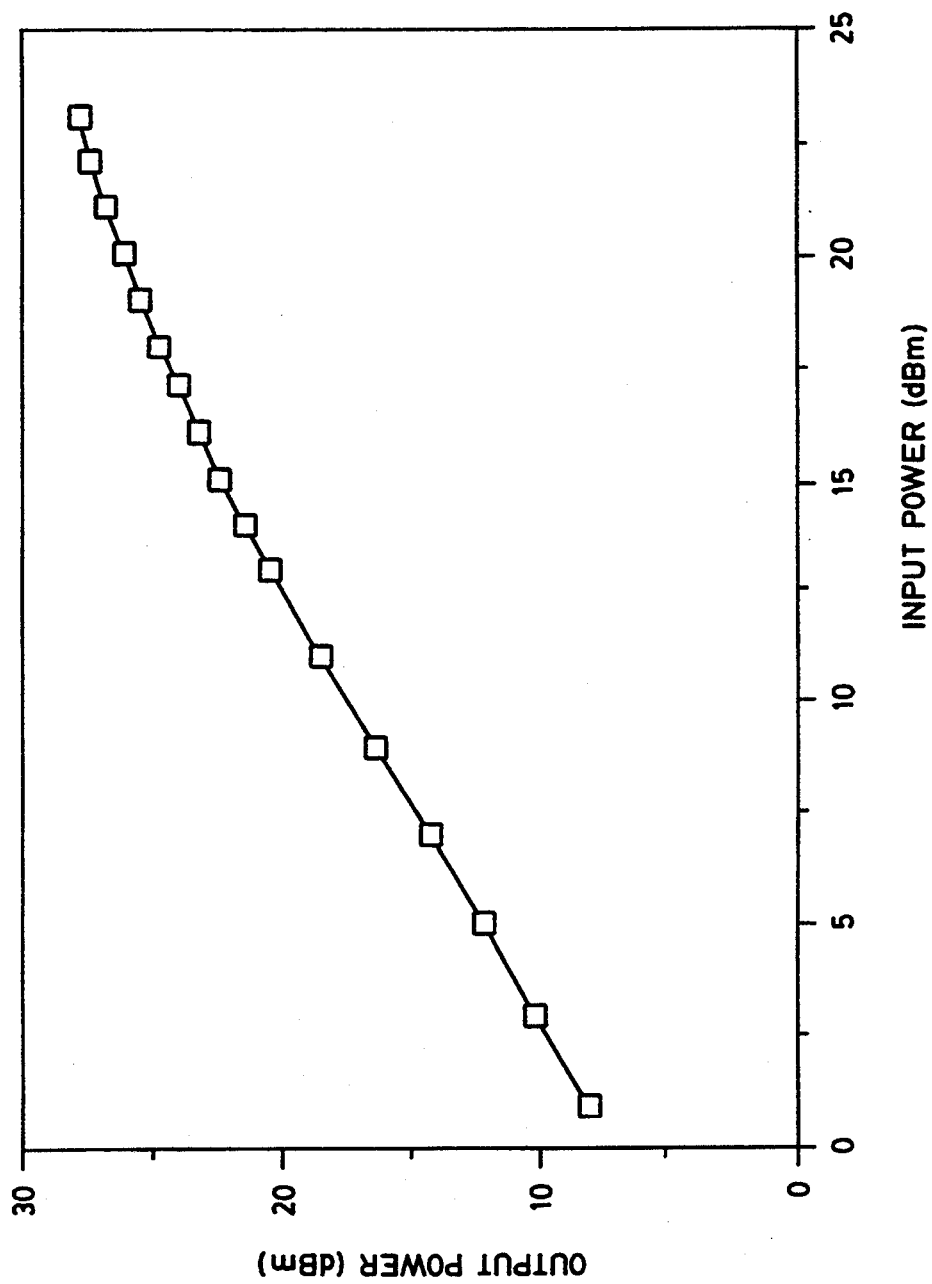
FIG. 7 is a graph of output power (dBm) vs. input power (dBm) showing the linearity of the microwave Doherty amplifier.
Figure 8:
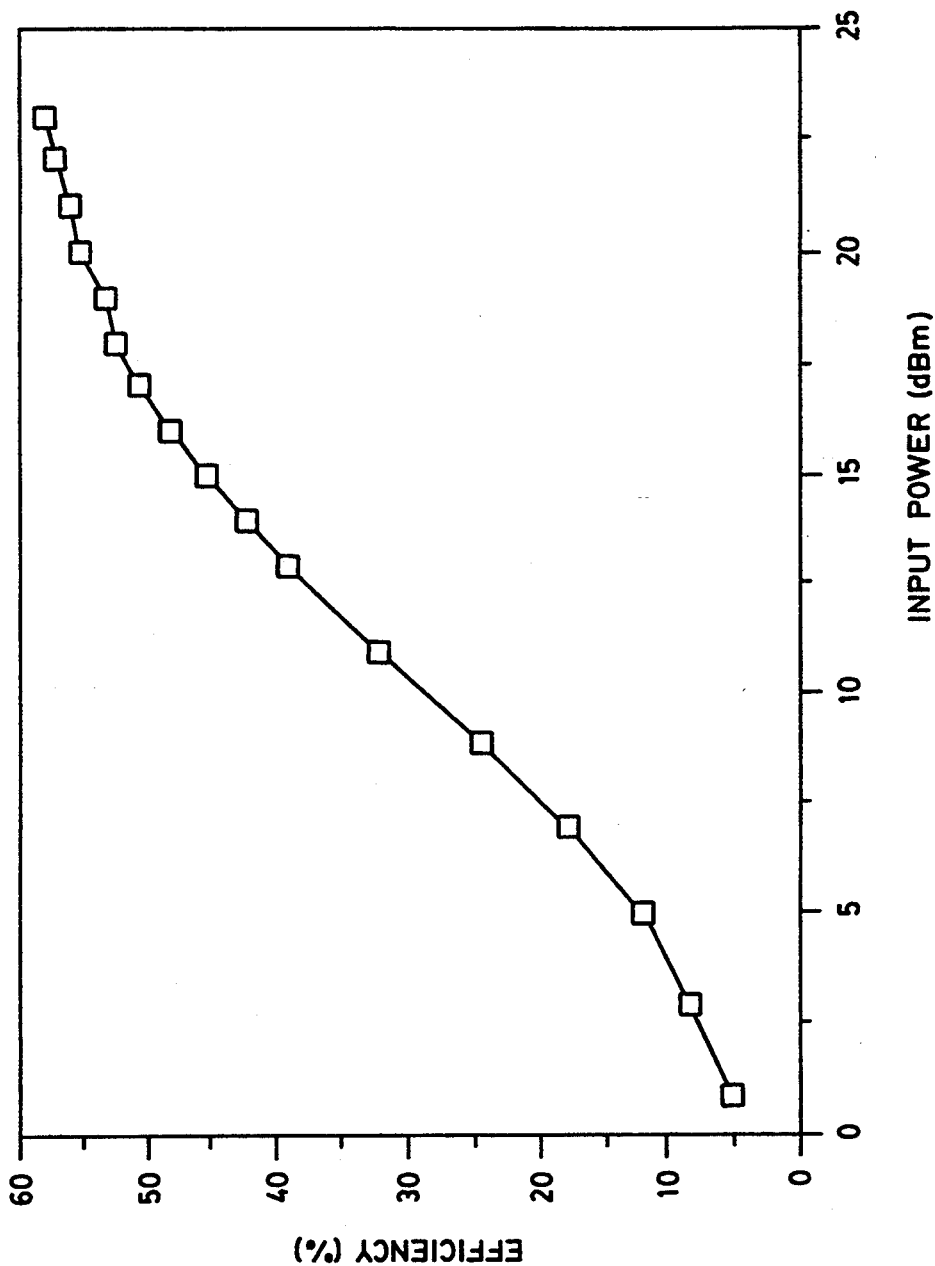
FIG. 8 is a graph of the efficiency (%) vs. input power (dBm) for the microwave Doherty amplifier showing the relative independence of efficiency as a function of input power in the range of 19 dBm to 23 dBm.

Referring now to FIG. 7 and FIG. 8, the linearity performance of the microwave Doherty amplifier 70 embodiment (FIG. 5), under continuous wave (CW) drive at 1300 MHz, is shown in FIG. 7 for the power output (dBm) versus power input (dBm), and in FIG. 8 a plot of efficiency (%) versus input power (dBm) is shown. A region of 4 dB of relatively constant efficiency can be observed in FIG. 8 from 23 dBm to 19 dBm input power. Power input at the one db compression point is 23 dBm (or 200 mW) with an efficiency of 58%. The efficiency above 44% is maintained at nearly an 8 dB range measured from the 1 dB compression point at 23 dBm output power. FIG. 7 shows that the output power falls linearly from 27.5 dBm to 23 dBm. A conventional amplifier operating Class B would not maintain its efficiency as a function of output power as well as the microwave Doherty amplifier 70. As the output power is reduced in the Class B amplifier, the efficiency also decreases in a $1/\sqrt{2}$ relationship. In the case where the signal to be amplified may vary in input power level, such as in a tapered phased-array antenna consisting of T/R module elements in great quantities, a microwave Doherty amplifier provides a considerable advantage over a conventional Class B amplifier.

Figure 9:
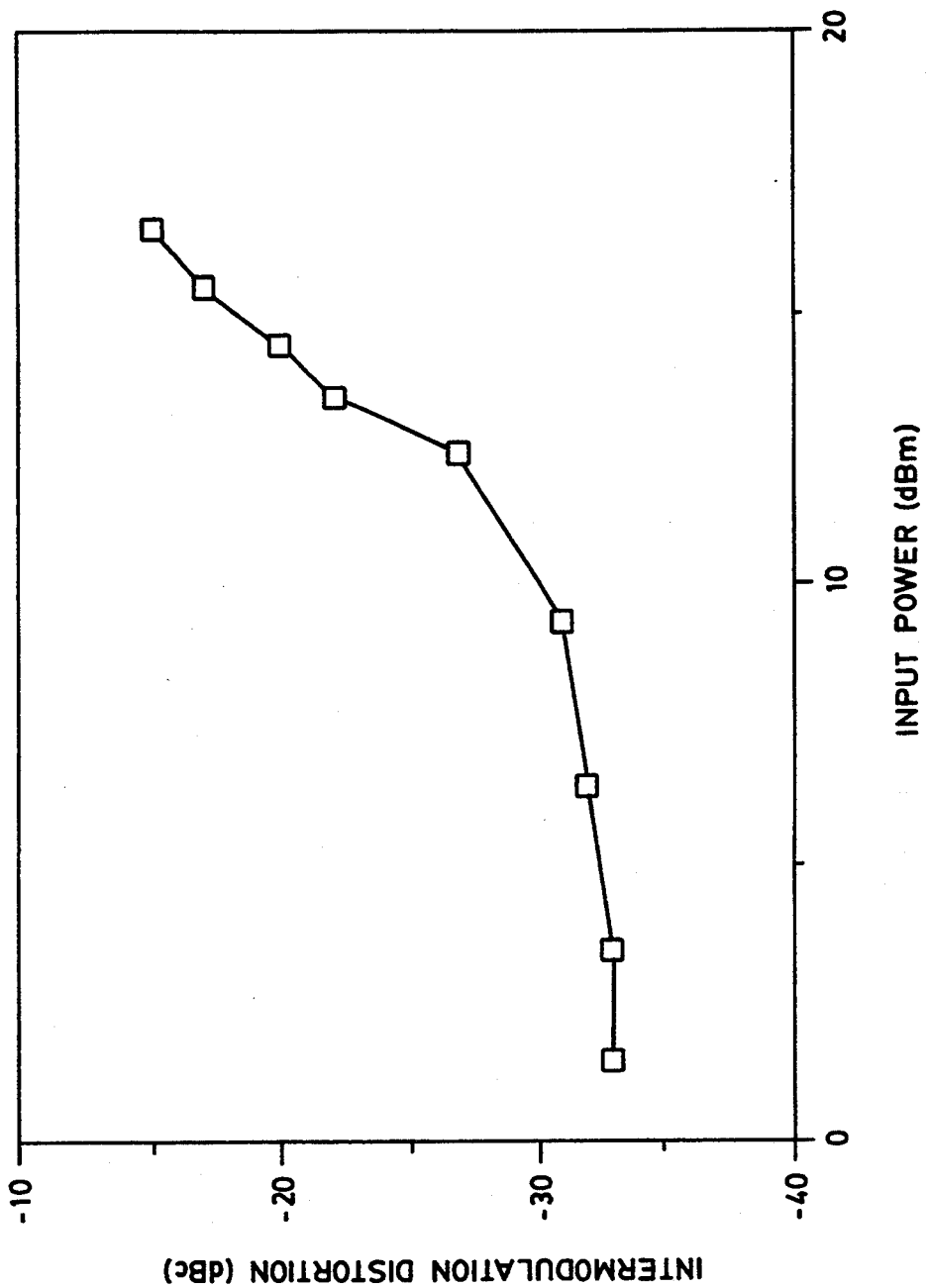
FIG. 9 is a graph of intermodulation distortion (dBc) for two equal amplitude input driving signals vs. input power (dBm) showing the region of linear operation for the microwave Doherty amplifier.
Figure 10:
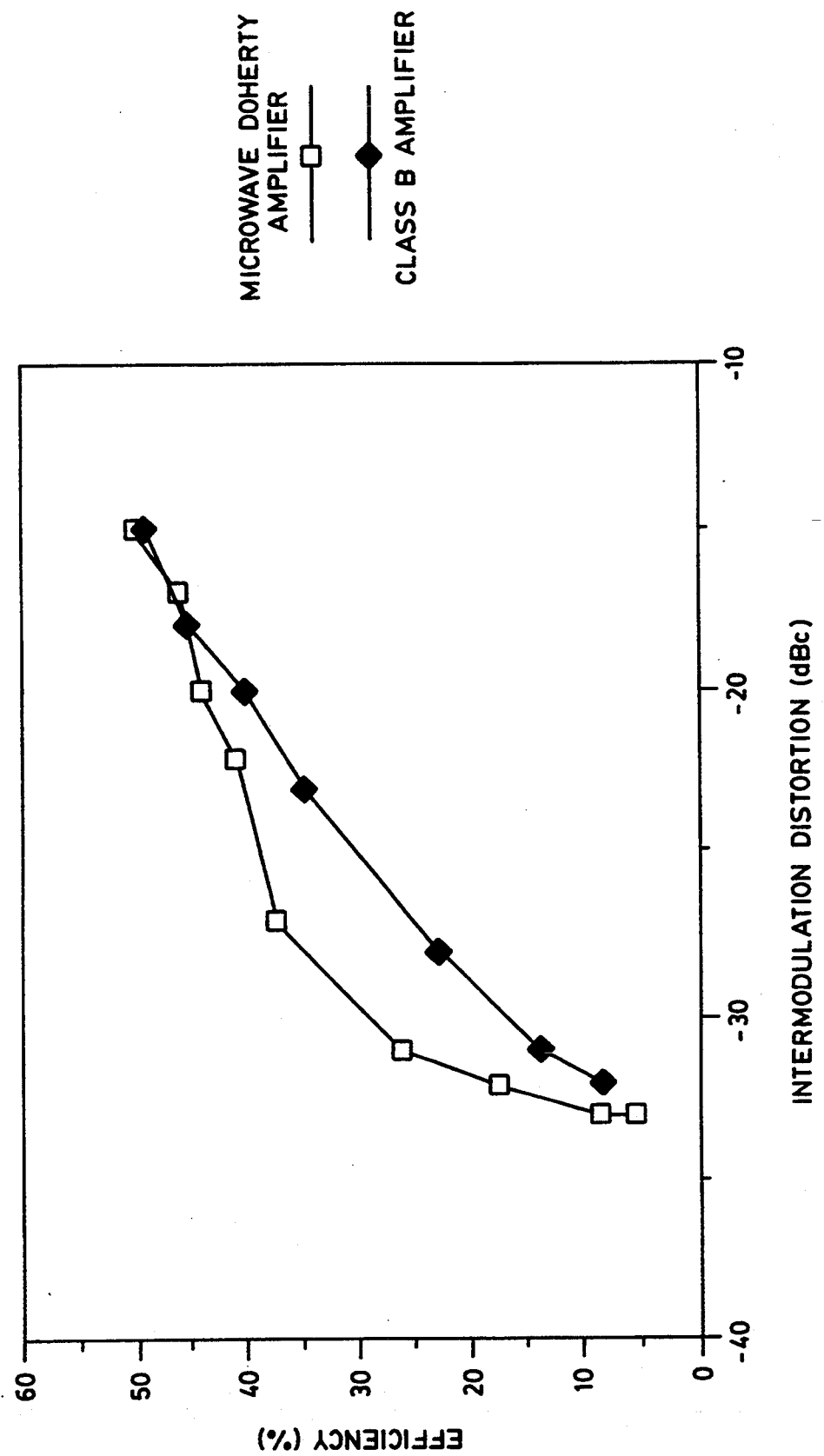
FIG. 10 is a graph of the efficiency (%) vs. intermodulation distortion (dBc) for the microwave Doherty amplifier and a typical Class B amplifier (using equivalent size MESFETs as for the microwave Doherty amplifier) showing the improved efficiency obtained with a microwave Doherty amplifier compared to the Class B amplifier at a given intermodulation distortion ratio.

Referring now to FIG. 9 and FIG. 10, the operational performance of the microwave Doherty amplifier 70 for two-tone operation is even more striking since to maintain equivalent stress levels at the active devices 48, 50, the average input drive power per tone must be reduced. A Class B amplifier would now operate with decreased efficiency even when putting out full linear output. Achieving reasonable linearity requires operating the Class B amplifier 3 dB to 7 dB below the 1 dB CW compression level where the efficiency is maximized. The microwave Doherty amplifier 70, however, does not lose efficiency as quickly due to a 4 dB extension beyond the point where the active device 48 of the carrier amplifier begins to saturate. This saturation of active device 48 results from the combined actions of the microwave Doherty network 64, and the active device 50 of the peak amplifier and a decreased slope of the efficiency versus input power curve shown in FIG. 8 relative to the Class B amplifier (not shown), where the efficiency versus input power curve decreases at a $1/\sqrt{2}$ rate. FIG. 9 shows a graph of the intermodulation distortion (dBc) level versus input power (dBc). A graph of the efficiency (%) versus intermodulation distortion (dBc) under two-tone conditions is shown in FIG. 10. Under multitone input drive conditions, the microwave Doherty amplifier 70 continues to show superior efficiency characteristics compared to a Class B amplifier even when backed-off from full output by as much as 10 dB. Modern digital modulation techniques often result in extremely complex multi-tone signals which a microwave Doherty amplifier 40, 70 is uniquely well-suited to handle.

Many modifications and alterations will be obvious to one of ordinary skill in the art without departing from the spirit and scope of the inventive concept. For example, various permutations are possible of multiple phasing arrangements to contrive the signals combining in phase at the desired point in the amplifier circuit. It is obvious that any of the stated phase relationships may be multiplied by any odd multiple of 90 degrees on either the peak or carrier side and still remain valid. It is also obvious that any of the networks described herein such as the input matching networks 44, 46 may be realized by means readily know to one of ordinary skill in the art. It is also obvious and has been specifically stated that not all of the elements described in FIG. 4 are necessary to implement the inventive concept, but in certain application requirements the various elements provide enhancements in basic performance of the microwave Doherty amplifier.

What is claimed is:

1. A microwave frequency amplifier comprising:

phase quadrature producing means coupled to an input signal for producing a phase quadrature relationship over a broad-band between a first output signal and a second output signal from said phase quadrature producing means;

carrier amplifier means for amplifying said first output signal from said phase quadrature producing means;

peak amplifier means for amplifying said second output signal from said phase quadrature producing means;

distributed line means coupled between an output of said carrier amplifier means and an output of said peak amplifier means for controlling a phase of said output of said carrier amplifier means relative to the output of said peak amplifier means whereby said carrier amplifier means output and said peak amplifier means output combine in additive phase, and said distributed line means further provides impedance transforming action to an apparent load presented to said carrier amplifier means as a function of a degree of conduction of said peak amplifying means;

predetermined output impedance producing means coupled to said distributed line means and said output of said peak amplifier means for producing a predetermined output impedance of said microwave frequency amplifier;

said predetermined output impedance producing means comprises means for providing an operational voltage source for said carrier amplifier means and said peak amplifier means; and said microwave frequency amplifier operates over a plurality of microwave frequencies including 1300 MHz.

2. The microwave frequency amplifier as recited in claim 1 wherein:

said input signal comprises multi-carrier signals.

3. The microwave frequency amplifier as recited in claim 1 wherein:

said input signal comprises a continuous single carrier that varies in amplitude.

4. The microwave frequency amplifier as recited in claim 1 wherein:

said input signal comprises a multi-carrier signal with each carrier signal varying in amplitude.

5. The microwave frequency amplifier as recited in claim 1 wherein:

said carrier amplifier means comprises a gallium arsenide semiconductor device.

6. The microwave frequency amplifier as recited in claim 1 wherein:

said peak amplifier means comprises a gallium arsenide semiconductor device.

7. The microwave frequency amplifier as recited in claim 1 wherein:

said distributed line means comprises a quarter-wave transformer.

8. The microwave frequency amplifier as recited in claim 1 wherein:

said degree of conduction of said peak amplifier means is determined by an input drive level of said second output signal from said phase quadrature producing means relative to a predetermined control input applied to said peak amplifier means.

9. A microwave frequency amplifier comprising:

phase quadrature producing means coupled to an input signal for producing a phase quadrature relationship over a broad-band between a first output signal and a second output signal from said phase quadrature producing means;

means for amplifying said first output signal;

first matching means coupled between said first output signal and said first output signal amplifying means for matching an impedance at an input of said first output signal amplifying means to an output impedance of said first output signal, said first matching means providing a low DC resistance and low reactance path at a frequency of a modulation envelope at baseband and providing sufficient RF signal isolation at a carrier frequency in order to bias said first output signal amplifying means;

means for amplifying said second output signal;

second matching means coupled between said second output signal and said second output signal amplifying means for matching an impedance at an input of said second output signal amplifying means to an output impedance of said second output signal, said second matching means providing a low DC resistance and low reactance path at the freqence of the modulation envelope at baseband and providing sufficient RF signal isolation at the carrier frequency in order to bias said second output signal amplifying means;

a first biasing means coupled to said first matching means for providing a bias to a control input of said first output signal amplifying means;

a second biasing means coupled to said second matching means for providing a bias to a control input of said second output signal amplifying means;

distributed line means coupled between an output of said first output signal amplifying means and an output of said second output signal amplifying means for controlling a phase of said output of said first output signal amplifying means relative to said output of said second output signal amplifying means whereby said first output signal amplifying means output and said second output signal amplifying means output combine in additive phase, and said distributed line means further provides impedance transforming action to an apparent load presented to said first output signal amplifying means as a function of a degree of conduction of said second output signal amplifying means;

predetermined output impedence producing means coupled to said distributed line means and said output of said second output signal amplifying means for producing a predetermined output impedance of said microwave frequency amplifier; and said predetermined output impedance producing means comprises means for providing an operational voltage source for said first output signal amplifying means and said second output signal amplifying means.

10. The microwave frequency amplifier as recited in claim 9 wherein:

said microwave frequency amplifier operates over a plurality of microwave frequencies including 1300 MHz.

11. The microwave frequency amplifier as recited in claim 10 wherein:

said degree of conduction of said second output signal amplifying means is determined by an input drive level relative to a predetermined control input applied to said second output signal amplifying means.

12. The microwave frequency amplifier as recited in claim 10 wherein said first matching means and said second matching means each comprises a band-pass network.

13. The microwave frequency amplifier as recited in claim 10 wherein each of said first and second biasing means comprises a bias voltage.

14. The microwave frequency amplifier as recited in claim 10 wherein:

a voltage source for a first output signal amplifying means is coupled to said first reactive network means.

15. The microwave frequency amplifier as recited in claim 10 wherein:

a voltage source for a second output signal amplifying means is coupled to said second reactive network means.

16. The microwave frequency amplifier as recited in claim 9 wherein:

said input signal comprises multi-carrier signals.

17. The microwave frequency amplifier as recited in claim 9 wherein:

said input signal comprises a continuous single carrier that varies in amplitude.

18. The microwave frequency amplifier as recited in claim 9 wherein:

said input signal comprises a multi-carrier signal with each carrier signal varying in amplitude.

19. The microwave frequency amplifier as recited in claim 9 wherein:
said first output signal amplifying means comprises a gallium arsenide semiconductor device.

20. The microwave frequency amplifier as recited in claim 9 wherein:
said second output signal amplifying means comprises a gallium arsenide semiconductor device.

21. The microwave frequency amplifier as recited in claim 9 wherein:
said distributed line means comprises a quarter-wave transformer.

22. The microwave frequency amplifier as recited in claim 9 wherein:
said predetermined output impedance producing means comprises a transmission line connected to the distributed line means.

23. The microwave frequency amplifier as recited in claim 9 wherein:
said degree of conduction of said second output signal amplifying means is determined by an input drive level relative to said control input applied to said second output signal amplifying means.

24. The microwave frequency amplifier as recited in claim 9 wherein said first matching means and said second matching means each comprises a transmission line.

25. The microwave frequency amplifier as recited in claim 9 wherein each of said first and second bias means comprises a bias tee.

26. The microwave frequency amplifier as recited in claim 9 wherein:
said second output signal amplifying means comprises a gallium arsenide semiconductor device.

27. A microwave frequency amplifier comprising:
phase quadrature producing means coupled to an input signal for producing a phase quadrature relationship over a broad-band between a first output signal and a second output signal from said phase quadrature producing means;
means for amplifying said first output signal;
first matching means coupled between said first output signal and said first output signal amplifying means for matching an impedance at an input of said first output signal amplifying means to an output impedance of said first output signal;
means for amplifying said second output signal;
second matching means coupled between said second output signal and said second output signal amplifying means for matching an impedance at an input of said second output signal amplifying means to an output impedance of said second output signal;
means coupled to said first matching means for providing a bias to a control input of said first output signal amplifying means;
means coupled to said second matching means for providing a bias to a control input of said second output signal amplifying means;
distributed line means coupled between an output of said first output signal amplifying means and an output of said second output signal amplifying means for controlling a phase of said output of said first output signal amplifying means relative to the output of said second output signal amplifying means whereby said first output signal amplifying means output and said second output signal amplifying means output combine in additive phase and said distributed line means further provides impedance transforming action to an apparent load presented to said first output signal amplifying means as a function of a degree of conduction of said second output signal amplifying means;
means coupled to said distributed line means and said output of said second output signal amplifying means for providing an output matching network;
first reactive network means coupled to said first output signal amplifying means output for canceling capacitance present at said first output signal amplifying means output; and
second reactive network means coupled to said second output signal amplifying means for canceling capacitance present at said second output signal amplifying means output.

28. The microwave frequency amplifier as recited in claim 27 wherein:
said microwave frequency amplifier operates over a plurality of microwave frequencies including 1300 MHz.

29. The microwave frequency amplifier as recited in claim 27 wherein:
said input signal comprises multi-carrier signals.

30. The microwave frequency amplifier as recited in claim 27 wherein:
said input signal comprises a continuous single carrier that varies in amplitude.

31. The microwave frequency amplifier as recited in claim 27 wherein:
said input signal comprises a multi-carrier signal with each carrier signal varying in amplitude.

32. The microwave frequency amplifier as recited in claim 27 wherein:
said first output signal amplifying means comprises a first gallium arsenide semiconductor device.

33. A microwave frequency amplifier comprising:
phase quadrature producing means coupled to an input signal for producing a phase quadrature relationship over a broad-band between a first output signal and a second output signal from said phase quadrature producing means;
means for amplifying said first output signal;
first matching means coupled between said first output signal and said first output signal amplifying means for matching an impedance at an input of said first output signal amplifying means to an output impedance of said first output signal;
means for amplifying said second output signal;
second matching means coupled between said second output signal and said second output signal amplifying means for matching an impedance at an input of said second output signal amplifying means to an output impedance of said second output signal;
means coupled to said first matching means for providing a bias to a control input of said first output signal amplifying means;
means coupled to said second matching means for providing a bias to a control input of said second output signal amplifying means;
distributed line means coupled between an output of said first output signal amplifying means and an output of said second output signal amplifying means for controlling a phase of said output of said first output signal amplifying means relative to an output of said second output signal amplifying means whereby said first output signal amplifying means output and said second output signal amplifying means output combine in additive phase and said distributed line means further provides impedance transforming action to an apparent load presented to said first output signal amplifying means as a function of a degree of conduction of said second output signal amplifying means;

means coupled to said distributed line means and said output of said second output signal amplifying means for providing an output matching network;

first reactive network means coupled to said first output signal amplifying means output for canceling capacitance present at said first output signal amplifying means output;

second reactive network means coupled to said second output signal amplifying means for canceling capacitance present at said second output signal amplifying means output;

means coupled to said first output signal amplifying means output for providing zero impedance to a second harmonic of a design frequency at said first output signal amplifying means output; and means coupled to said second output signal amplifying means output for providing zero impedance to a second harmonic of a design frequency at said second output signal amplifying means output.

34. The microwave frequency amplifier as recited in claim 33 wherein:
said microwave frequency amplifier operates over a plurality of microwave frequencies including 1300 MHz.

35. The microwave frequency amplifier as recited in claim 33 wherein:
said input signal comprises multi-carrier signals.

36. The microwave frequency amplifier as recited in claim 33 wherein:
said input signal comprises a continuous single carrier that varies in amplitude.

37. The microwave frequency amplifier as recited in claim 33 wherein:
said input signal comprises a multi-carrier signal with each carrier signal varying in amplitude.

38. The microwave frequency amplifier as recited in claim 33 wherein:
said first output signal amplifying means comprises a gallium arsenide semiconductor device.

39. The microwave frequency amplifier as recited in claim 33 wherein:
said second output signal amplifying means comprises a gallium arsenide semiconductor device.

40. The microwave frequency amplifier as recited in claim 33 wherein:
said degree of conduction of said second output signal amplifying means is determined by an input drive level relative to said control input applied to said second output signal amplifying means.

41. The microwave frequency amplifier as recited in claim 33 wherein said first matching means and said second matching means each comprises a band-pass network.

42. The microwave frequency amplifier as recited in claim 33 wherein said biasing means comprises a bias voltage.

43. The microwave frequency amplifier as recited in claim 33 wherein:
a voltage source for said first output signal amplifying means is coupled to said first reactive network means.

44. The microwave frequency amplifier as recited in claim 33 wherein:
a voltage source for said second output signal amplifying means is coupled to said second reactive network means.

45. A method of operating a high efficiency microwave frequency amplifier comprising the steps of:
providing a phase quadrature relationship over a broad-band between a first output signal and a second output signal from a phase quadrature producing means coupled to an input signal;

amplifying said first output signal from said phase quadrature producing means with a carrier amplifier means;

amplifying said second output signal from said phase quadrature producing means with a peak amplifier means;

controlling a phase of said output of said carrier amplifier means relative to the output of said peak amplifier means with a distributed line means coupled between an output of said carrier amplifier and an output of said peak amplifier whereby said carrier amplifier means output and said peak amplifier means output combine in additive phase, and said distributed line means further providing impedance transforming action to an apparent load presented to said carrier amplifier means as a function of a degree of conduction of said peak amplifier means;

producing a predetermined output impedance of said microwave frequency amplifier with means coupled to said distributed line means and said output of said peak amplifier means;

providing an operational voltage source for said carrier amplifier means and said peak amplifier means from said predetermined output impedance producing means; and operating said microwave frequency amplifier over a plurality of microwave frequencies including 1300 MHz.

46. The method as recited in claim 45 wherein said step of providing a phase quadrature relationship comprises the step of said phase quadrature producing means being coupled to an input signal having multi-carrier signals.

47. The method as recited in claim 45 wherein said step of providing a phase quadrature relationship comprises the step of said phase quadrature producing means being coupled to an input signal having a continuous single carrier that varies in amplitude.

48. The method as recited in claim 45 wherein said step of providing a phase quadrature relationship comprises the step of said phase quadrature producing means being coupled to an input signal having a multi-carrier signal with each carrier signal varying in amplitude.

49. The method as recited in claim 45 wherein said step of amplifying said first output signal includes the step of operating a gallium arsenide semiconductor device.

50. The method as recited in claim 45 wherein said step of amplifying said second output signal includes the step of operating a gallium arsenide semiconductor device.

51. A method of operating a microwave frequency amplifier having improved efficiency and linearity comprising the steps of:

producing a phase quadrature relationship over a broad-band between a first output signal and a second output signal from a phase quadrature producing means coupled to an input signal;

amplifying said first output signal;

matching an impedance at an input of said first output signal amplifying means to an output impedance of said first output signal with a first matching means coupled between said first output signal and said first output signal amplifying means, said first matching means providing a low DC resistance and low reactance path at a frequency of a modulation envelope at baseband and providing sufficient RF signal isolation at a carrier frequency in order to bias said first output signal amplifying means;

amplifying said second output signal;

matching an impedance at an input of said second output signal amplifying means to an output impedance of said second output signal with a second matching means coupled between said second output signal and said second output signal amplifying means, said second matching means providing a low DC resistance and low reactance path at a frequency of a modulation envelope at baseband and providing sufficient RF signal isolation at a carrier frequency in order to bias said second output signal amplifying means;

biasing a control input of said first output signal amplifying means with a first biasing means coupled to said first matching means;

biasing a control input of said second output signal amplifying means with a second biasing means coupled to said second matching means;

controlling a phase of said output of said first output signal amplifying means relative to the output of said second output signal amplifying means with a distributed line means coupled between an output of said first output signal amplifying means and an output of said second output signal amplifying means, whereby said first output signal amplifying means output and said second output signal amplifying means output combine in additive phase, and said distributed line means further providing impedance transforming action to an apparent load presented to said first output signal amplifying means as a function of a degree of conduction of said second output signal amplifying means;

producing a predetermined output impedance of said microwave frequency amplifier with means coupled to said distributed line means and said output of said second output signal amplifying means; and providing an operational voltage source for said first output signal amplifying means and said second output signal amplifying means from said predetermined output impedance producing means.

52. The method as recited in claim 51 wherein said microwave frequency amplifier operates over a plurality of microwave frequencies including 1300 MHz.

53. The method as recited in claim 51 wherein said step of providing a phase quadrature relationship comprises the step of said phase quadrature producing means being coupled to an input signal having multi-carrier signals.

54. The method as recited in claim 51 wherein said step of providing a phase quadrature relationship comprises the step of said phase quadrature producing means being coupled to an input signal having a continuous single carrier that varies in amplitude.

55. The method as recited in claim 51 wherein said step of providing a phase quadrature relationship comprises the step of said phase quadrature producing means being coupled to an input signal having multi-carrier signals with each carrier signal varying in amplitude.

56. The method as recited in claim 51 wherein said step of amplifying said first output signal includes the step of operating a gallium arsenide semiconductor device.

57. The method as recited in claim 51 wherein said step of amplifying said second output signal includes the step of operating a gallium arsenide semiconductor device.

58. A method of operating a microwave frequency amplifier having improved efficiency and linearity comprising the steps of:

producing a phase quadrature relationship over a broad-band between a first output signal and a second output signal from a phase quadrature producing means coupled to an input signal;

amplifying said first output signal;

matching an impedance at an input of said first output signal amplifying means to an output impedance of said first output signal with a first matching means coupled between said first output signal and said first output signal amplifying means;

amplifying said second output signal;

matching an impedance at an input of said second output signal amplifying means to an output impedance of said second output signal with a second matching means coupled between said second output signal and said second output signal amplifying means;

biasing a control input of said first output signal amplifying means with a first biasing means coupled to said first matching means;

biasing a control input of said second output signal amplifying means with a second biasing means coupled to said second matching means;

controlling a phase of said output of said first output signal amplifying means relative to an output of said second output signal amplifying means with a distributed line means coupled between an output of said first output signal amplifying means and an output of said second output signal amplifying means, whereby said first output signal amplifying means output and said second output signal amplifying means output combine in additive phase, and said distributed line means further providing impedance transforming action to an apparent load presented to said first output signal amplifying means as a function of a degree of conduction of said second output signal amplifying means;

producing a predetermined output impedance of said microwave frequency amplifier with means coupled to said distributed line means and said output of said second output signal amplifying means;

canceling capacitance present at said first output signal amplifying means output with a first reactive network means coupled to said first output signal amplifying means output;

canceling capacitance present at said second output signal amplifying means output with a second reactive network means coupled to said second output signal amplifying means;

providing zero impedance to a second harmonic of a design frequency at said first output signal amplifying means output with means coupled to said first output signal amplifying means output; and providing zero impedance to a second harmonic of a design frequency at said second output signal amplifying means output with means coupled to said second output signal amplifying means output.

59. The method as recited in claim 59 wherein said microwave frequency amplifier operates over a plurality of microwave frequencies including 1300 MHz.

60. The method as recited in claim 58 wherein said step of providing a phase quadrature relationship comprises the step of said phase quadrature producing means being coupled to an input signal having multi-carrier signals.

61. The method as recited in claim 58 wherein said step of providing a phase quadrature relationship comprises the step of said phase quadrature producing means being coupled to an input signal having a continuous single carrier that varies in amplitude.

62. The method as recited in claim 58 wherein said step of providing a phase quadrature relationship comprises the step of said phase quadrature producing means being coupled to an input signal having a multi-carrier signal with each carrier signal varying in amplitude.

63. The method as recited in claim 58 wherein said step of amplifying said first output signal includes the step of operating a gallium arsenide semiconductor device.

64. The method as recited in claim 58 wherein said step of amplifying said second output signal includes the step of operating a gallium arsenide semiconductor device.

* * * * *